United States Patent [19]
Ban

[11] Patent Number: 6,065,142
[45] Date of Patent: May 16, 2000

[54] ROM TESTING CIRCUIT

[75] Inventor: Akira Ban, Kanagawa, Japan

[73] Assignee: NEC Corporation, Japan

[21] Appl. No.: 09/096,933

[22] Filed: Jun. 12, 1998

[30] Foreign Application Priority Data

Jun. 13, 1997 [JP] Japan .................................. 9-156579

[51] Int. Cl.⁷ .......................... G11C 29/00; G01R 31/28; G01R 31/02
[52] U.S. Cl. ...................... 714/718; 714/733; 324/158.1; 324/763
[58] Field of Search .................................. 714/718, 719, 714/724, 733, 734, 735, 742, 819, 820, 824; 324/73.1, 158.1, 763; 365/201

[56] References Cited

U.S. PATENT DOCUMENTS

| | | | |
|---|---|---|---|
| 5,017,848 | 5/1991 | Takahashi .............................. | 318/568.1 |
| 5,055,774 | 10/1991 | Catt ....................................... | 324/158.1 |
| 5,440,724 | 8/1995 | Boothroyd et al. ...................... | 714/733 |
| 5,442,643 | 8/1995 | Adachi .................................... | 714/733 |
| 5,446,395 | 8/1995 | Goto ....................................... | 324/763 |

FOREIGN PATENT DOCUMENTS

| | | |
|---|---|---|
| 64-28835 | 1/1989 | Japan . |
| 5-218157 | 8/1993 | Japan . |
| 6-150698 | 5/1994 | Japan . |

*Primary Examiner*—Hoa T. Nguyen
*Attorney, Agent, or Firm*—Ostrolenk, Faber, Gerb & Soffen, LLP

[57] ABSTRACT

Disclosed is A ROM testing circuit for testing ROMs embedded in respective chips arranged on a wafer, which ROM testing circuit comprises units which are embedded in the respective chips, wherein each of the units comprises: input means for receiving a signal outputted from the ROM embedded in one adjacent chip or from each of the ROMs embedded in two or more respective adjacent chips; output means for outputting a signal outputted from the ROM formed in the chip to which the unit belongs to the one adjacent chip or to the two or more adjacent chips; and means for comparing the signal outputted from the ROM in the chip to which the unit belongs with the signal or signals inputted via the input means. With this arrangement, all adjacent chips can be tested with respect to their ROMs simultaneously.

7 Claims, 3 Drawing Sheets

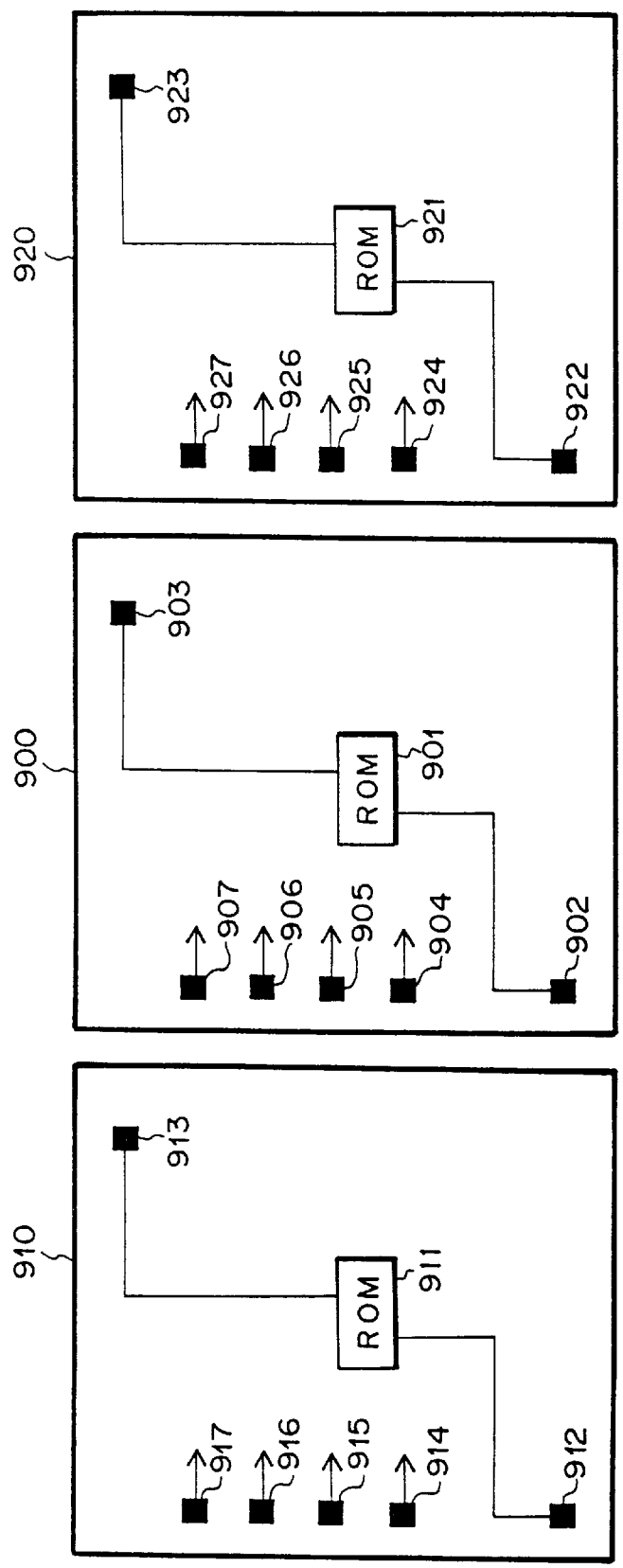

ROM TESTING CIRCUIT

BACKGROUND OF THE INVENTION

1. Field of the Invention

The present invention relates to a ROM testing circuit for testing ROMs embedded in microcomputer chips and particularly, for testing such ROMs in the state of being formed on wafers.

2. Description of the Prior Art

FIG. 3 shows a conventional ROM testing circuit. In FIG. 3, microcomputer chips (hereinafter referred to as "chips") 900, 910 and 920 have PADs 902 to 907, 912 to 917, and 922 to 927 formed thereon, respectively. These PADs can be used as terminals for external connection. When these chips are tested in the state of being formed on the wafers, electrically conductive probes are applied to selected PADs to examine the function of the chips.

Specifically, in chip 900, the output side of PAD 902 is connected to ROM 901, and the output side of ROM 901 is connected to PAD 903. PAD 904 is allotted to a relatively high-voltage source; PAD 905 is allotted to a relatively low-voltage source; PAD 906 is allotted to a reset signal; and PAD 907 is allotted to a clock signal.

This also applies to chips 910 and 920.

The manner in which ROM 901 of chip 900 is tested is explained as follows: PAD 904 is connected to a predetermined high-voltage source (hereinafter referred to as "VDD"); PAD 905 is connected to a predetermined low-voltage source (hereinafter referred to as "GND"); and a reset signal is applied to PAD 906. Then, a signal is applied to PAD 902 to render the test-mode circuit embedded in ROM 901 be in a predetermined state. In response to application of a clock signal to PAD 907, the contents of ROM 901 are outputted to be compared with prescribed or expected values. Thus, a decision can be made as to whether or not ROM 901 can work normally.

Likewise, chips 920 and 930 can be tested.

As disclosed in JPA-5-218157, the self-contained test-mode circuit of ROM 901 and the associated PAD 902 in FIG. 3 can be separately disposed in different chips to reduce the size of chip 900 accordingly.

JPA-6-150698 discloses a technique for facilitating the testing of similar memories embedded in an LSI chip. According to the technique, those memory circuits are made to work simultaneously so that their output signals may be compared with each other to make a decision as to whether or not they can work normally.

As for the conventional ROM testing circuit of FIG. 3, it has the following disadvantages.

First, expected values which are used in making a decision as to whether or not the ROM works normally must be stored in the memory of an LSI tester. In order to meet an ever increasing ROM capacity, the LSI tester need to be equipped with an vast capacity of memory.

Secondly, all the chips must be tested with respect to the function of the self-contained ROM, thus requiring much time involved for the required test.

Thirdly, the contents of ROM 901 appear on PAD 903, whereby the security can not be maintained while strict security must be maintained because of the user's program being written in the ROM.

As for JPA-5-218157, a separate test logic section for each chip must be formed on a selected area in the wafer and the area to be cut away must be included in the wafer, thus requiring a significant extra area exclusively allotted to the cutting-and-separating work of such a test logic section from the chip. Therefore, the number of chips per wafer becomes reduced, although the area of each microcomputer chip can be significantly reduced.

The first and second disadvantages explained above with reference to FIG. 3 cannot be solved in JPA-5-218157 publication.

As for JPA-6-150698, the first and second disadvantages are solved. It, however, relates to an LSI chips having a plurality of the memories of the same word and bit formed therein. These memories can be tested by applying the same input signals thereto at the same time, and by comparing output data with each other. Therefore, this solution is not general, or rather, is practicable only for testing such LSI chips that have the same memory embedded therein.

The memories disclosed in JPA-6-150698 are RAMs which are writable and readable in microcomputers. This is essentially different from the present invention in which the contents of the self-contained ROMs of adjacent chips are compared with each other to make a required test on such ROMs. In the JPA-6-150698, ROMs which store user's programs are not supposed to be used, and therefore, it cannot solve the third disadvantage.

SUMMARY OF THE INVENTION

An object of the present invention is to provide a ROM testing circuit which can test ROMs in a short time, requires no memory to hold the expected values, and keep security of data in ROMs.

According to the present invention, there is provided A ROM testing circuit for testing ROMs embedded in respective chips arranged on a wafer, which ROM testing circuit comprises units which are embedded in the respective chips, wherein each of the units comprises: input means for receiving a signal outputted from the ROM embedded in one adjacent chip or from each of the ROMs embedded in two or more respective adjacent chips; output means for outputting a signal outputted from the ROM formed in the chip to which the unit belongs to the one adjacent chip or to the two or more adjacent chips; and means for comparing the signal outputted from the ROM in the chip to which the unit belongs with the signal or signals inputted via the input means.

The chips may be microcomputer chips.

In the ROM testing circuit, conductor lines transporting signals used in adjacent chips in common may be connected each other between the adjacent chips.

The signals used in adjacent chips in common may be any of a high-voltage source, a low-voltage source, a reset signal, or a clock signal.

Each chip may further comprise switching devices of which each is equipped with a control terminal and a pad-and-conductor for applying a test-mode signal to the control terminal of each switching device from the exterior, wherein the conductor lines for transporting signals to be used in adjacent chips in common can be connected each other between the adjacent chips via the switching devices.

The pad of the pad-and-conductor for inputting a test-mode signal may be grounded via a resistor.

Each chip may further comprise another conductor means to supply the ROM with the test-mode signal.

The ROM testing circuit according to the present invention is useful in testing the self-contained ROMs embedded in the microcomputer chips in the state of being formed on a wafer. It comprises means for making electric connections to at least one adjacent microcomputer chip and a comparison circuit for making a comparison between the signal outputted from the respective ROM and at least one signal outputted from the ROMs in adjacent chip. With this arrangement the aforementioned disadvantages, that is, the increasing of the memory capacity of an associated LSI tester used for ROM testing, the increasing of time involved for testing, and the possible leakage of users' programs from ROMs can be solved.

The idea of the present invention is based on the following facts: lattice defects and other kind of defects in chips generally occur at random in manufacturing process of LSIs; in other words, there is little probability that defects in a chip appear at the same positions with the adjacent. Therefore, all the adjacent chips can be supposed not to be impaired if they operate in the same manner, while at least one of adjacent chips is impaired if they do not operate in the same manner.

Thus, a decision as to whether ROMs in selected chips on a wafer should be passed or rejected can be made by making comparisons between adjacent chips with respect to those ROMs. The time involved for testing, therefore, can be reduced substantially, as compared with the ROM testing effected on each individual chip.

It is unnecessary to prepare prescribed or expected values for ROMs, which was required in the conventional ROM testing. Memory capacity of the associated LSI tester may be reduced.

Also, advantageously, no signal representing the contents of ROMs appears at the output terminal of the chip, and therefore, the contents of ROMs can be kept secret. The self-contained ROM of each chip cannot be tested after being separated from each other, thus keeping users' programs secret.

Still advantageously, no testing logic section need be formed on a wafer, permitting the whole space of the wafer to be used for forming chips. The number of chips per wafer, therefore, is not reduced.

Other objects and advantages of the present invention will be understood from the following description of first and second preferred embodiments of the present invention, which are shown in accompanying drawings:

BRIEF DESCRIPTION OF THE DRAWINGS

FIG. 3 is a circuit diagram showing adjacent chips formed horizontally side by side on a wafer, which adjacent chips are to be tested separately according to the conventional ROM testing method.

DESCRIPTION OF THE PREFERRED EMBODIMENTS

Figure 1:
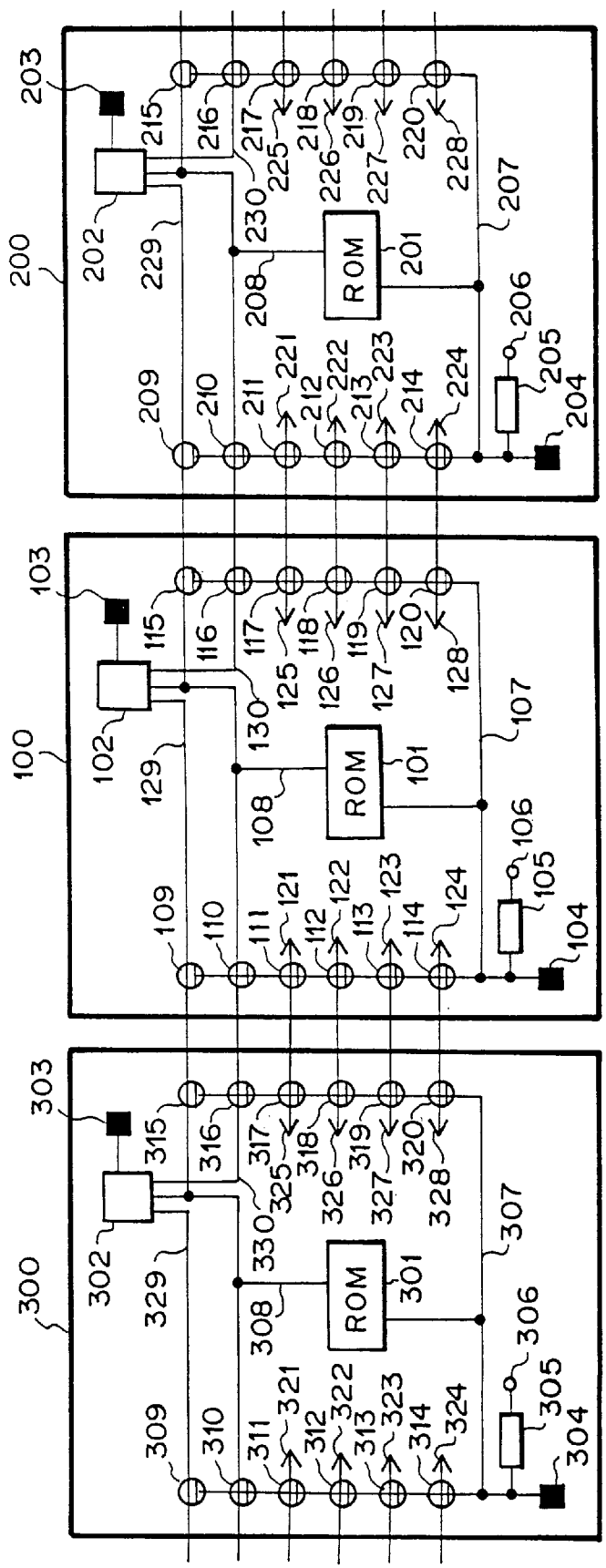
FIG. 1 is a circuit diagram according to the first embodiment of the present invention showing three adjacent chips formed horizontally side by side on a wafer.

Referring to FIG. 1, a required ROM testing can be effected on all the three adjacent chips by applying test-mode signals to PADs 104, 204 and 304 of chips 100, 200 and 300, respectively, to automatically make electric connections between the adjacent chips, and at the same time to render each ROM 101, 201 and 301 be in test-mode operation, and then, by permitting the signals outputted from ROMs 101, 201 and 301 to be compared.

The signal representing the result of comparison appears at PAD 103 in chip 100. When the agreement is found in the result of comparison with respect to ROM function, ROMs 101, 201, 301 of respective chips 100, 200 and 300 are supposed to work normally. There is no more necessity of testing chips 200 and 300 with respect to respective ROMs 201 and 301 separately.

Figure 2:
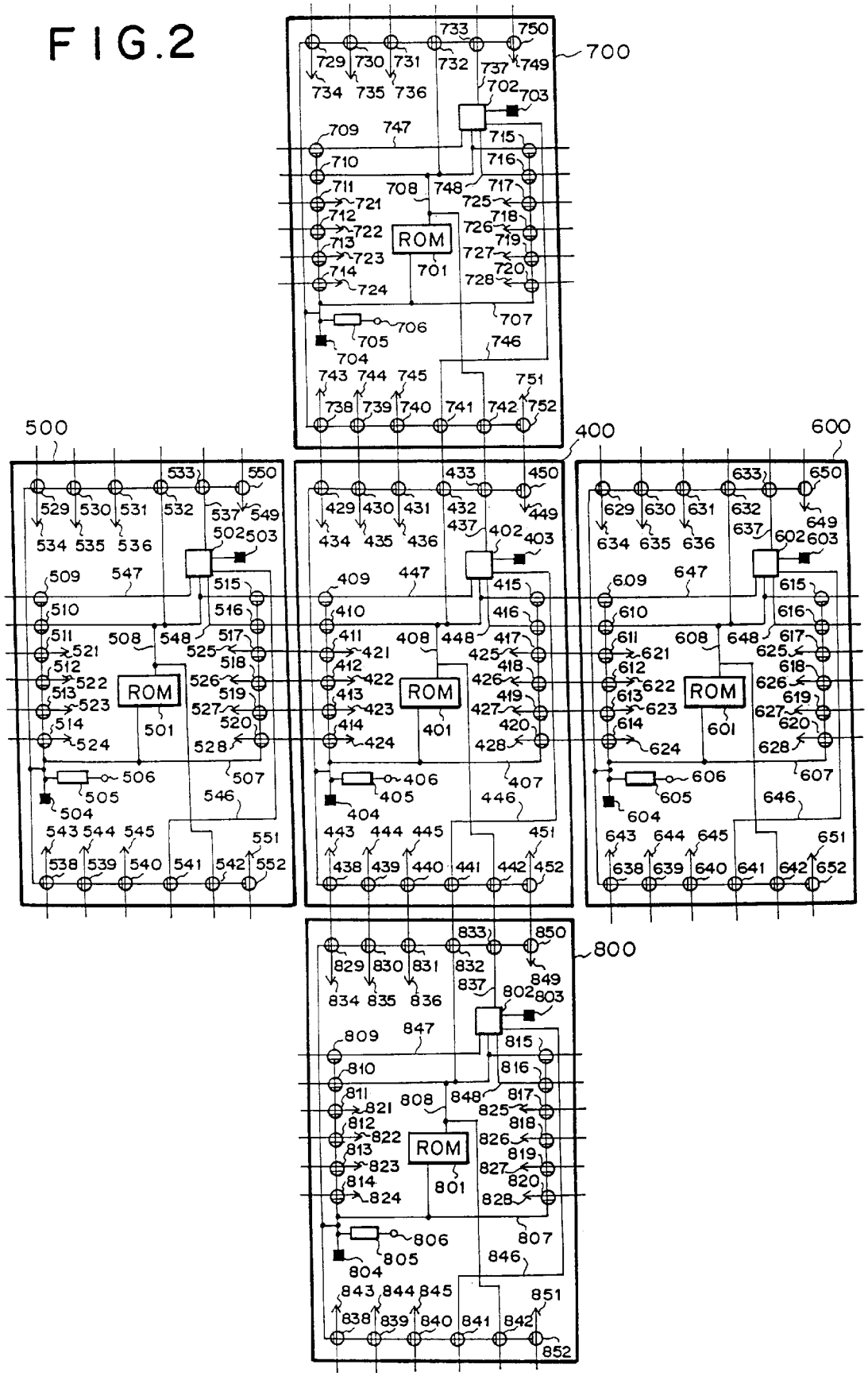
FIG. 2 is a circuit diagram according to the second embodiment of the present invention showing five adjacent chips formed crosswise on a wafer.

Referring to FIG. 2, a test-mode signal is applied to PAD 404 of central chip 400 and additionally to PADs 504, 604, 704 and 804 of adjacent chips 400, 500, 604, 700 and 800 to automatically make electric connections therebetween, and the signals outputted from ROMs 401, 501, 601, 701 and 801 of respective chips 400, 500, 604, 700 and 800 are compared with each other. The signal representing the result of comparison with respect to ROM function appears at PAD 403 in central chip 400. When the agreement is found in the resultant comparison with respect to ROM function, ROMs 401, 501, 601, 701 and 801 of respective chips 400, 500, 600, 700 and 800 are supposed to work normally, and therefore, there is no more necessity of testing chips 500, 600, 700 and 800 with respect to ROMs 501, 601, 701 and 801 separately.

These first and second embodiments are explained in more detail as follows:

First Embodiment

FIG. 1 is a circuit diagram of the first embodiment. In the drawing, microcomputer chips 100, 200 and 300 are arranged horizontally side by side on a wafer. These three chips are selected among a lot of similar chips formed on the wafer.

Concerning circuit connections in the chip 100, PAD 104 is connected to test-mode signal line 107, which is directed to: ground GND 106 via resistor 105; transfer gates 109 to 120; and ROM 101. Output signal 108 outputted from ROM 101 is directed to comparison circuit 102. At the same time, output signal 308 outputted from ROM 301 of the adjacent chip 300 is directed to comparison circuit 102 via transfer gates 315 and 109, and output signal 208 outputted from ROM 201 of adjacent chip 200 is directed to comparison circuit 102 via transfer gates 210 and 116. The output terminal of comparison circuit 102 is connected to PAD 103 in the chip 100. Conductor lines 124 and 128 are of the high-voltage source VDD and connected each other in chip 100.

Conductor lines 123 and 127 are of the low-voltage source and connected each other in chip 100. A reset signal which appears on conductor lines 122 and 126 are used to reset chip 100, and a clock signal which appears on conductor lines 121 and 125 are used to render chip 100 be in operation.

Chips 200 and 300 have the same structure as chip 100, and therefore, no explanation of them is required.

Chips 100, 200 and 300 have extra PADs formed thereon to permit VDD, GND, reset and clock signals to be inputted from the exterior, although these PADs are not shown.

Assuming that chip 100 is tested, chip 100 is connected to VDD and GND via the relevant PADs, and then, a reset signal is applied to chip 100 via the relevant PAD. A test-mode signal is applied to chip 100 via PAD 104 to render ROM 101 be in test-mode. Then, in response to the inputting of a clock signal, output signal 108 representing the contents of ROM 101 appears at its output terminal. Application of the test-mode signal to chip 100 causes transfer gates 109 to 120 to open, thereby establishing required electric connections from central chip 100 to adjacent chips 200 and 300, and likewise, application of the test-mode signal to chips 200 and 300 via PADs 204 and 304, causes transfer gates 209 to 220 and 309 to 320 to open, respectively, thereby permitting central chip 100 to supply adjacent chips 200 and 300 with VDD, GND, reset and clock signals, and permitting the output signals outputted from ROMs 201 and 301 of adjacent chips 200 and 300 to be directed to comparison circuit 102 conversely.

Thus, the output signals outputted from ROMs 101, 201, and 301 of respective chips 100, 200, and 300 can be compared with each other by simply applying probes to PADs of chip 100, a prove to PAD 204 of chip 200, and a prove to PAD 304 of chip 300, effecting the simultaneous checking of the ROMs of the three chips with respect to their function.

After separating chips 100, 200 and 300 from each other, the contents of ROMs 101, 201 and 301 cannot be read out, so that users' programs is prevented from leaking. As mentioned above, all of the transfer gates 109 to 128 remain in the off-condition unless a test-mode signal is applied to PAD 104. When cutting the intervenient connections between the transfer gates of two adjacent chips 100 and 200 or 100 and 300 to separate them from each other, any two or more intervenient connections may happen to be connected across a cutter blade. Even in this event, there is no fear of causing any conductors at different potentials in each chip to be short-circuited by the cutter blade because all of the transfer gates remain in the off-condition, thus preventing appearance of short-circuits in the chip, and undesired potential invasion into the chip as well.

Likewise, four or more chips can be tested easily with respect to their ROM function simultaneously as, for instance, follows: in FIG. 1, assume that an additional chip (not shown) is connected for instance, to the left side of chip 300, and then, the relevant probes are applied to: some selected PADs for applying the VDD, GND, the test-mode signal, the reset signal and the clock signal to chip 100; to PAD 103 for retrieving the result of comparison between chips 100, 200, and 300; to PAD 204 for applying the test-mode signal to chip 200; to PAD 304 for applying the test-mode signal to chip 300; and to the relevant PAD for applying the test-mode signal in the additional chip. In this case, the result of comparison between chips 100, 300 and the additional chip can be obtained at probe 303 in addition to the result of comparison between chips 100, 200, and 300 at probe 103. Combining these results, the result of comparison between the four chips can be obtained.

Second Embodiment

FIG. 2 is a circuit diagram of the second embodiment. In the drawing, microcomputer chips 400, 500, 600, 700 and 800 are arranged crosswise on a wafer. These five chips are selected among a lot of similar chips formed on the wafer. The cross-shaped chip-arrangement can be formed by: modifying central chip 100 of FIG. 1 so as to permit additional chips 700 and 800 to be connected to the upper and lower sides of the central chip just like chips 200 and 300 connected to the right and left sides of central chip 100 in FIG. 1.

The cross-shaped chip-arrangement of FIG. 2 is different from FIG. 1 in that comparison circuit 402 has 5 input ports formed therein. All of the ROMs 401, 501, 601, 701 and 801 can be tested simultaneously simply by applying the relevant probes to some selected PADs for applying the VDD, GND, the reset signal on conductive lines 422, 426, 436 and 445, and the clock signal on conductive lines 421, 425, 449 and 451, to PAD 404 for applying the test-mode signal on test-mode signal line 407, and to PAD 403 for retrieving the result of comparison; to PAD 504 for applying the test-mode signal on test-mode signal line 507 in chip 500; to PAD 604 for applying the test-mode signal on test-mode signal line 607 in chip 600; to PAD 704 for applying the test-mode signal on test-mode signal line 707 in chip 700; and to PAD 804 for applying the test-mode signal on test-mode signal line 807 in chip 800.

As may be understood from the above explanation, a decision as to whether or not any of the ROMs of selected chips formed in a single wafer can work well can be made simply by making a comparison between adjacent chips with respect to the contents of their ROMs. Thus, the chips can be tested quickly, as compared with the separate testing of individual chips. No expected values for ROMs to be tested need to be prepared, and therefore, the memory capacity of associated LSI tester may be reduced.

Moreover, no signal representing the contents of ROM appears at the terminal of the comparison circuit, thus keeping the contents of ROMs secret. No test logic section is needed to be formed in a wafer, preventing the number of chips per wafer from being reduced.

What is claimed is:

1. A ROM testing circuit for testing ROMs embedded in respective chips arranged on a wafer, which ROM testing circuit comprises units which are embedded in said respective chips, wherein each of said units comprises:

input means for receiving a signal outputted from the ROM embedded in one adjacent chip or from each of the ROMs embedded in two or more respective adjacent chips;

output means for outputting a signal outputted from the ROM formed in the chip to which said unit belongs to said one adjacent chip or to said two or more adjacent chips; and means for comparing the signal outputted from said ROM in said chip to which said unit belongs with the signal or signals inputted via said input means.

2. The ROM testing circuit as set forth in claim 1, wherein said chips are microcomputer chips.

3. The ROM testing circuit as set forth in claim 1, wherein conductor lines transporting signals used in adjacent chips in common are connected each other between said adjacent chips.

4. The ROM testing circuit as set forth in claim 3, wherein said signals used in adjacent chips in common are any of a high-voltage source, a low-voltage source, a reset signal, or a clock signal.

5. The ROM testing circuit as set forth in claim 3, wherein each chip further comprises switching devices of which each is equipped with a control terminal and a pad-and-conductor for applying a test-mode signal to said control terminal of each switching device from the exterior, wherein the conductor lines for transporting signals to be used in adjacent chips in common can be connected each other between said adjacent chips via said switching devices.

6. The ROM testing circuit as set forth in claim 5, wherein the pad of said pad-and-conductor for inputting a test-mode signal is grounded via a resistor.

7. The ROM testing circuit as set forth in claim 5, wherein each chip further comprises another conductor means to supply said ROM with said test-mode signal.

\* \* \* \* \*